US012727505B2

(12) United States Patent
Liu et al.

(10) Patent No.: US 12,727,505 B2
(45) Date of Patent: Sep. 1, 2026

(54) METHOD FOR REDUCING WARPAGE OCCURRED TO SUBSTRATE DURING PACKAGING PROCESS

(71) Applicant: TONG HSING ELECTRONIC INDUSTRIES, LTD., Taipei City (TW)

(72) Inventors: Yu-Hsiang Liu, Taipei City (TW); Li-Chun Hung, Taipei City (TW)

(73) Assignee: TONG HSING ELECTRONIC INDUSTRIES, LTD., Taipei City (TW)

(*) Notice: Subject to any disclaimer, the term of this patent is extended or adjusted under 35 U.S.C. 154(b) by 378 days.

(21) Appl. No.: 18/405,740

(22) Filed: Jan. 5, 2024

(65) Prior Publication Data

US 2025/0149348 A1 May 8, 2025

(30) Foreign Application Priority Data

Nov. 8, 2023 (TW) ................................ 112143109

(51) Int. Cl.
*H10W 74/01* (2026.01)
*H10P 95/90* (2026.01)
(Continued)

(52) U.S. Cl.
CPC ........... *H10W 74/016* (2026.01); *H10P 95/90* (2026.01); *H10W 42/121* (2026.01); *H10W 74/014* (2026.01); *H10W 90/00* (2026.01)

(58) Field of Classification Search
CPC ............. H10W 74/016; H10W 74/114; H10W 42/121; H10W 74/014
See application file for complete search history.

(56) References Cited

U.S. PATENT DOCUMENTS 7,256,108 B2 * 8/2007 Park ........................ H10P 72/74 438/33
7,795,743 B2 * 9/2010 Kim ..................... H05K 3/3436 257/772
(Continued)

FOREIGN PATENT DOCUMENTS

CN 101556947 A * 10/2009
JP 5187863 B2 * 4/2013 .......... H10W 74/129
TW 202310089 A * 3/2023 .......... H10W 70/685

*Primary Examiner* — Evren Seven
(74) *Attorney, Agent, or Firm* — Birch, Stewart, Kolasch & Birch, LLP

(57) ABSTRACT

A method for reducing warpage occurred to a substrate during a packaging process includes attaching a plurality of dies to an upper surface of the substrate; attaching an adhesive material having a first curing temperature to a lower surface of the substrate; applying a liquid-packaging material having a second curing temperature to surroundings of the dies; heating the substrate, the adhesive material, and the liquid-packaging material to a heating temperature not less than the first curing temperature and the second curing temperature; and cooling the substrate, the adhesive material, and the liquid-packaging material to a room temperature. When being cooled to the room temperature, the liquid-packaging material applies an upper-surface shrinkage stress to the upper surface of the substrate, the adhesive material applies a lower-surface shrinkage stress to the lower surface of the substrate, and the lower-surface shrinkage stress is substantially equal to the upper-surface shrinkage stress.

6 Claims, 14 Drawing Sheets

S1

(51) Int. Cl.
*H10W 42/00* (2026.01)
*H10W 90/00* (2026.01)

(56) References Cited

U.S. PATENT DOCUMENTS

| | | | | |
|---|---|---|---|---|
| 2004/0113283 | A1* | 6/2004 | Farnworth | H10P 52/00 257/E29.022 |
| 2007/0224729 | A1* | 9/2007 | Reiss | H10W 74/012 257/E21.503 |
| 2012/0244664 | A1* | 9/2012 | Jin | H10W 74/117 438/118 |
| 2012/0251791 | A1* | 10/2012 | Kawai | H10W 74/114 451/58 |
| 2013/0069245 | A1* | 3/2013 | Uchiyama | H10W 74/114 257/734 |
| 2013/0270719 | A1* | 10/2013 | Malatkar | H10W 72/00 257/777 |
| 2017/0069579 | A1* | 3/2017 | Kim | H10W 42/121 |
| 2018/0166396 | A1* | 6/2018 | Lee | H10W 42/121 |
| 2019/0252328 | A1* | 8/2019 | Jeng | H10W 42/121 |
| 2021/0035795 | A1* | 2/2021 | Peng | H10P 72/0432 |

* cited by examiner

S1

S2

METHOD FOR REDUCING WARPAGE OCCURRED TO SUBSTRATE DURING PACKAGING PROCESS

CROSS-REFERENCE TO RELATED APPLICATION

This non-provisional application claims priority under 35 U.S.C. § 119(a) to patent application No. 112143109 filed in Taiwan, R.O.C. on Nov. 8, 2023, and the entire contents of which are hereby incorporated by reference.

BACKGROUND

Technical Field

The instant disclosure relates to a method for reducing warpage occurred to a substrate during a packaging process.

Related Art

In a conventional packaging process performed on an integrated circuit chip, dies are first attached to a substrate, and then an I/O junction on the chip is electrically connected to a corresponding metal pin on the lead frame in a manner of wire bonding. Next, through a filling/dispensing process or a molding process, the packaging material is wrapped on surfaces of the dies so as to protect the chip and prevent the chip from the exterior.

However, when the dies are attached to the substrate (particularly, the substrate having organic components), after the filling process (or referred to as the dispensing process) or the molding process is completed, it is often found that the entire of the substrate has warpage (which may be referred to FIG. 8 and will be described in detail later), thereby affecting the subsequent processes or even being detrimental to the subsequent processes.

SUMMARY

In view of this, a method for reducing warpage occurred to a substrate during a packaging process according to an embodiment of the instant disclosure is provided. The method comprises attaching a plurality of dies to an upper surface of the substrate; attaching an adhesive material to a lower surface of the substrate, wherein the adhesive material has a first curing temperature; applying a liquid-packaging material to surroundings of the dies, wherein the liquid-packaging material has a second curing temperature; heating the substrate, the adhesive material, and the liquid-packaging material to a heating temperature not less than the first curing temperature and the second curing temperature; and cooling the substrate, the adhesive material, and the liquid-packaging material to a room temperature. When the liquid-packaging material is cooled to the room temperature, the liquid-packaging material applies an upper-surface shrinkage stress to the upper surface of the substrate. When the adhesive material is cooled to the room temperature, the adhesive material applies a lower-surface shrinkage stress to the lower surface of the substrate, and the lower-surface shrinkage stress is substantially equal to the upper-surface shrinkage stress.

In addition, a method for reducing warpage occurred to a substrate during a packaging process according to an embodiment of the instant disclosure is also provided. The method comprises attaching a plurality of dies to an upper surface of the substrate; attaching an adhesive material to a lower surface of the substrate, wherein the adhesive material has a first curing temperature; heating a molding material to a molding temperature and applying the molding material to surroundings of the dies, wherein the molding material has a third curing temperature; heating the substrate, the adhesive material, and the molding material to a heating temperature not less than the first curing temperature and the third curing temperature; and cooling the substrate, the adhesive material, and the molding material to a room temperature. When the molding material is cooled to the room temperature, the molding material applies an upper-surface shrinkage stress to the upper surface of the substrate. When the adhesive material is cooled to the room temperature, the adhesive material applies a lower-surface shrinkage stress to the lower surface of the substrate, and the lower-surface shrinkage stress is substantially equal to the upper-surface shrinkage stress.

DETAILED DESCRIPTION

In the following exemplary embodiments, the term "up" or "down" is used only to describe a position shown in the attached figures, and an actual position is not limited thereto.

The following describes a method for reducing warpage occurred to a substrate during a filling process according to some embodiments.

Figure 1A:
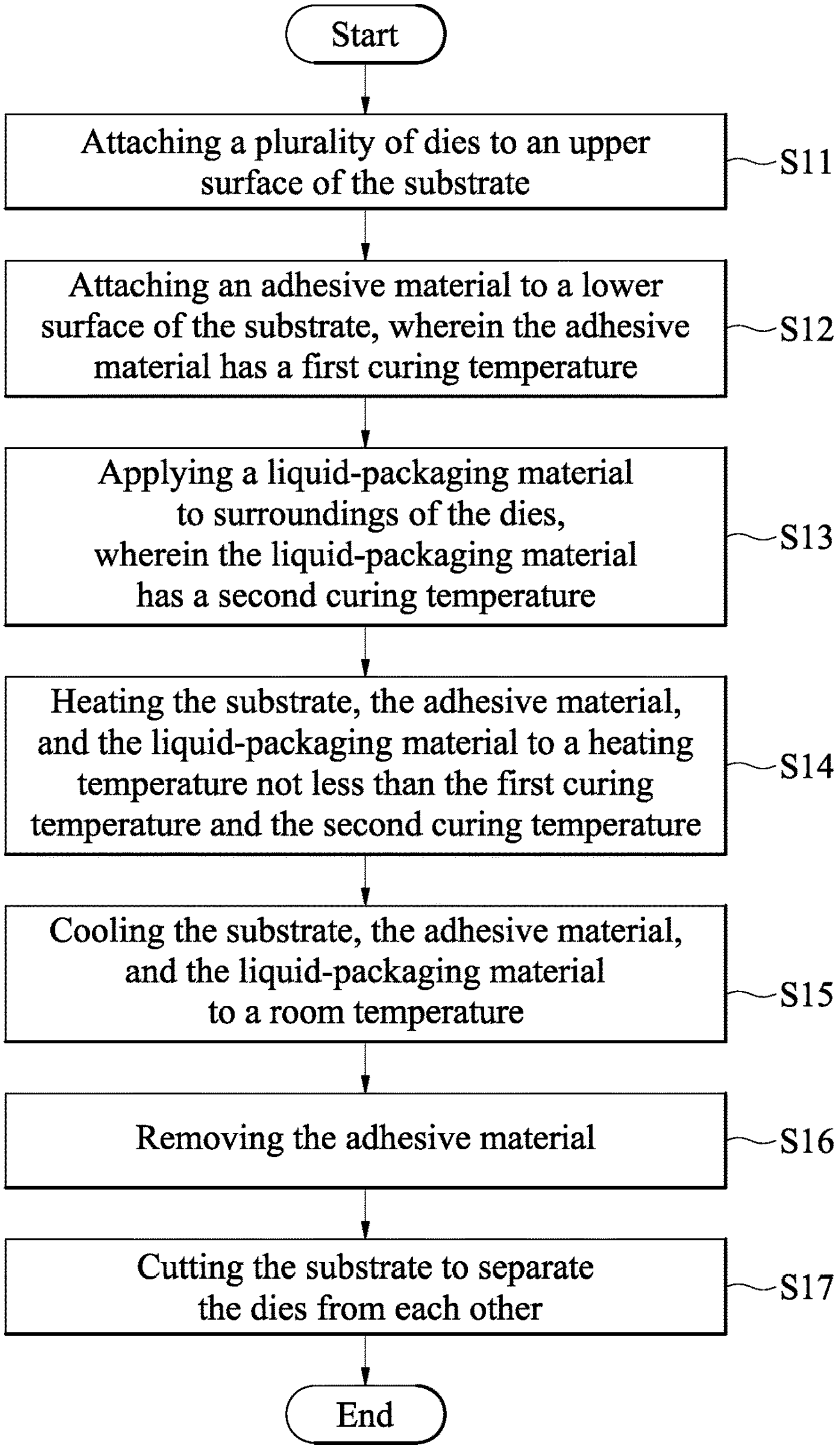
FIG. 1A illustrates a flow chart of a method for reducing warpage occurred to a substrate during a packaging process according to a first embodiment of the instant disclosure.

Please refer to FIG. 1A, which is a flow chart of a method S1 for reducing warpage occurred to a substrate 10 during a packaging process according to the first embodiment. With reference to FIG. 2 to FIG. 6, steps S11 to S17 are described in detail as follows.

Figure 2:
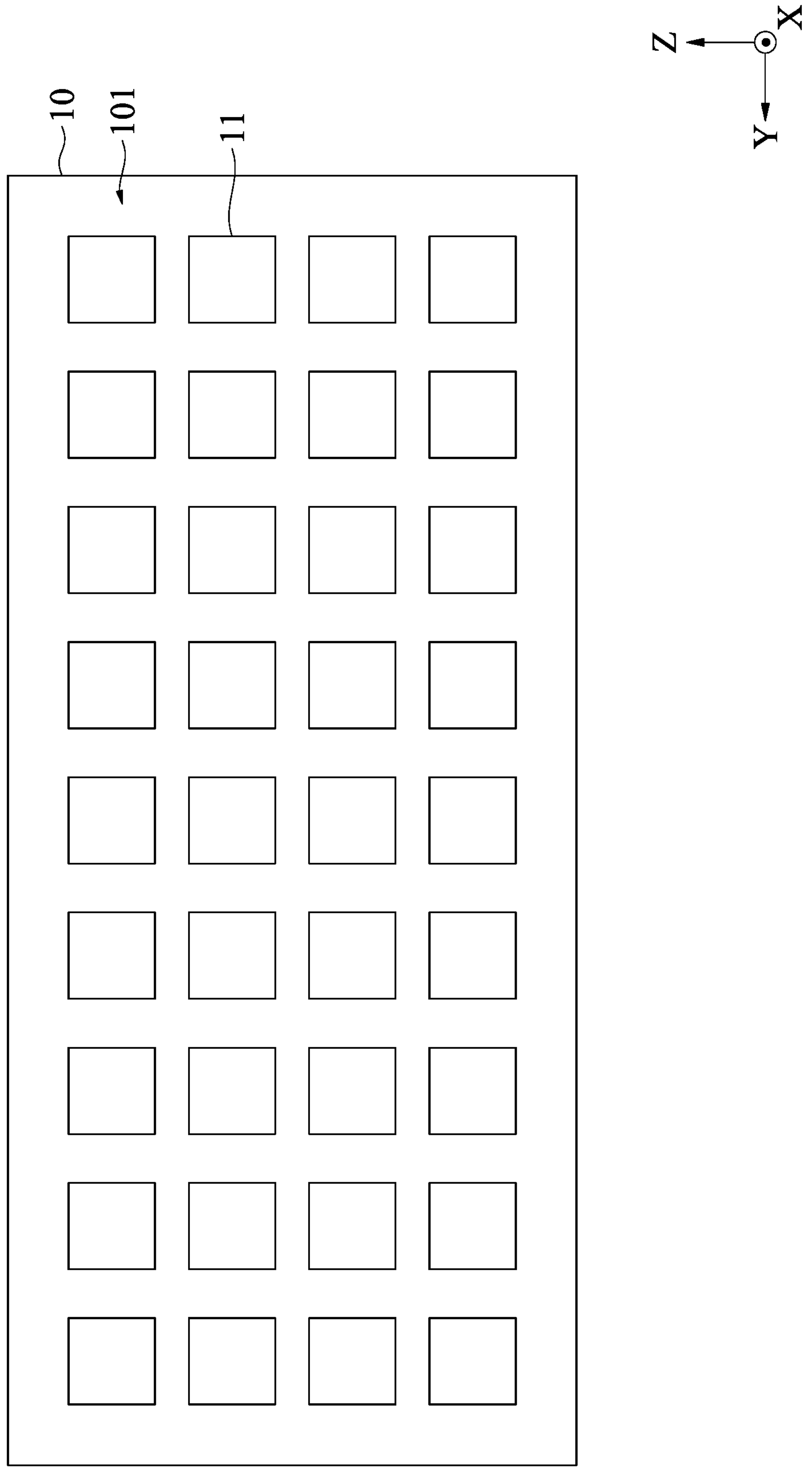
FIG. 2 illustrates a schematic structural view in a top view (i.e., the YZ plane) of a substrate and a plurality of dies according to an embodiment of the instant disclosure.
Figure 3:
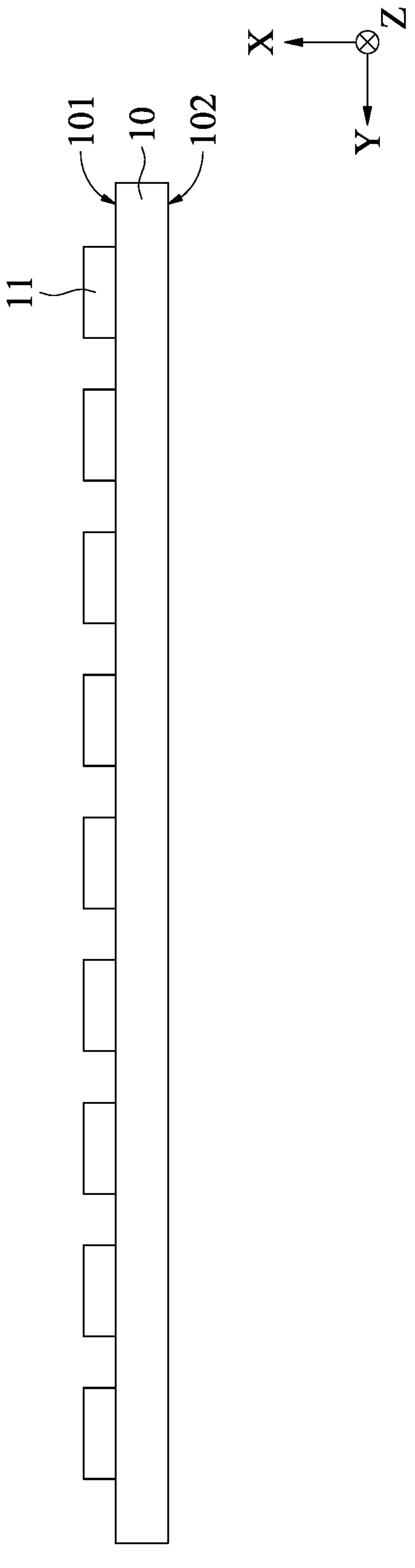
FIG. 3 illustrates the schematic structural view in the XY plane of the substrate and the dies as shown in FIG. 2.

In step S11, attach a plurality of dies 11 to the upper surface 101 of the substrate 10, as shown in FIG. 2 and FIG. 3. The substrate 10 may be a Bismaleimide Triazine (BT) substrate, an Ajinomoto Build-up Film (ABF) substrate, or other substrate suitable for the Ball Grid Array (BGA) packaging process. The term "attach/attaching" may refer to a connection through an insulating adhesive or a conductive adhesive. For example, the insulating adhesive may be an epoxy resin, and the conductive adhesive may be a silver conductive paste.

Figure 4:
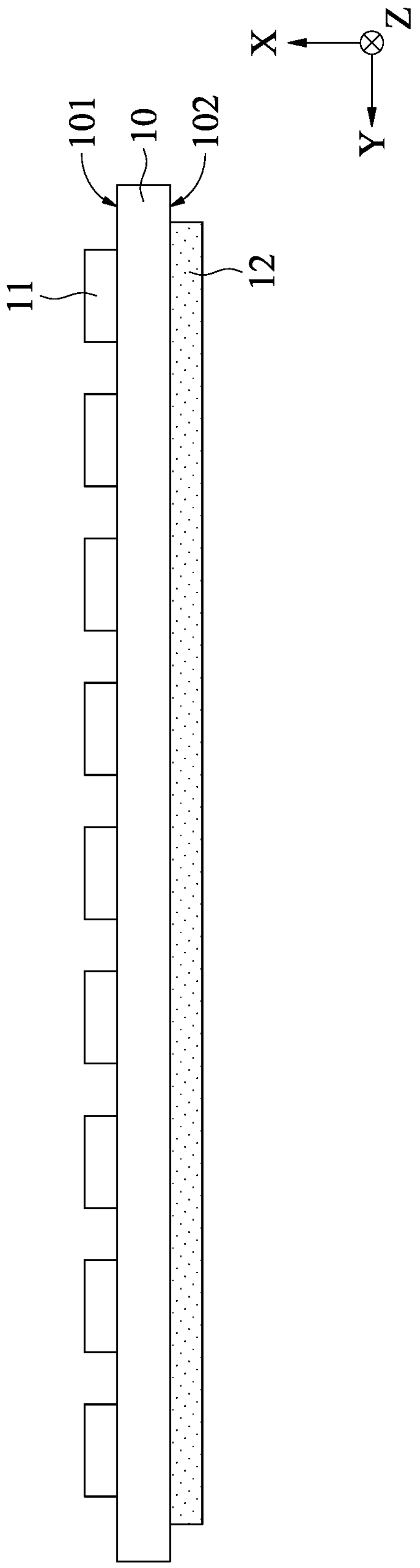
FIG. 4 illustrates the schematic structural view in the XY plane of the substrate, the dies, and the adhesive material as shown in FIG. 2.
Figure 5:
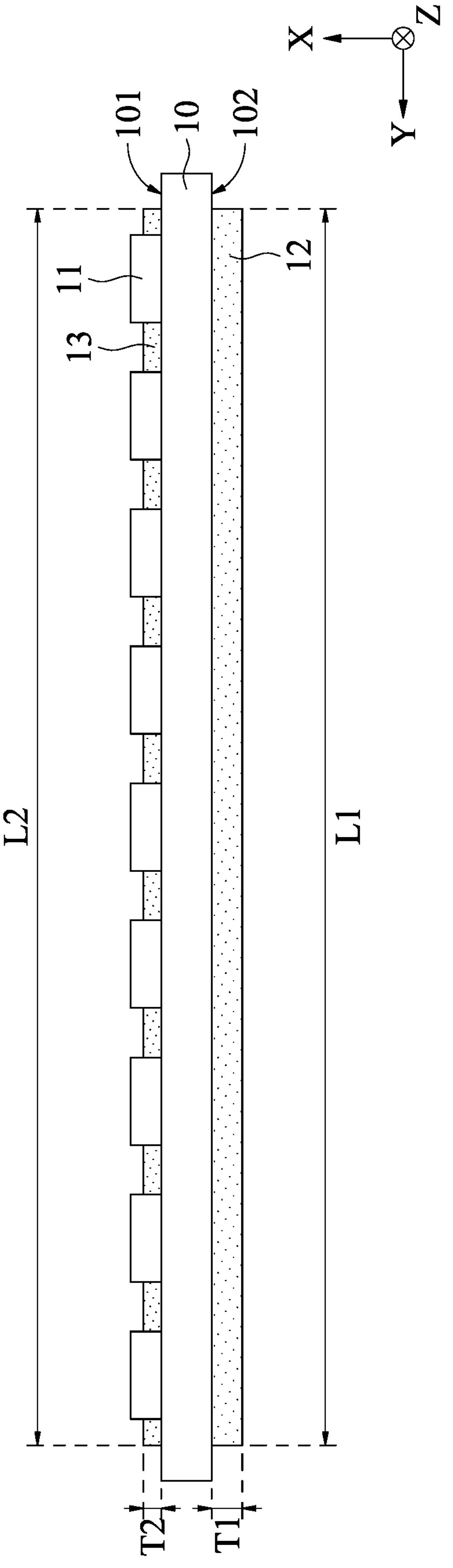
FIG. 5 illustrates a schematic structural view in the XY plane of the substrate, the dies, and the adhesive material according to an embodiment of the instant disclosure.
Figure 6:
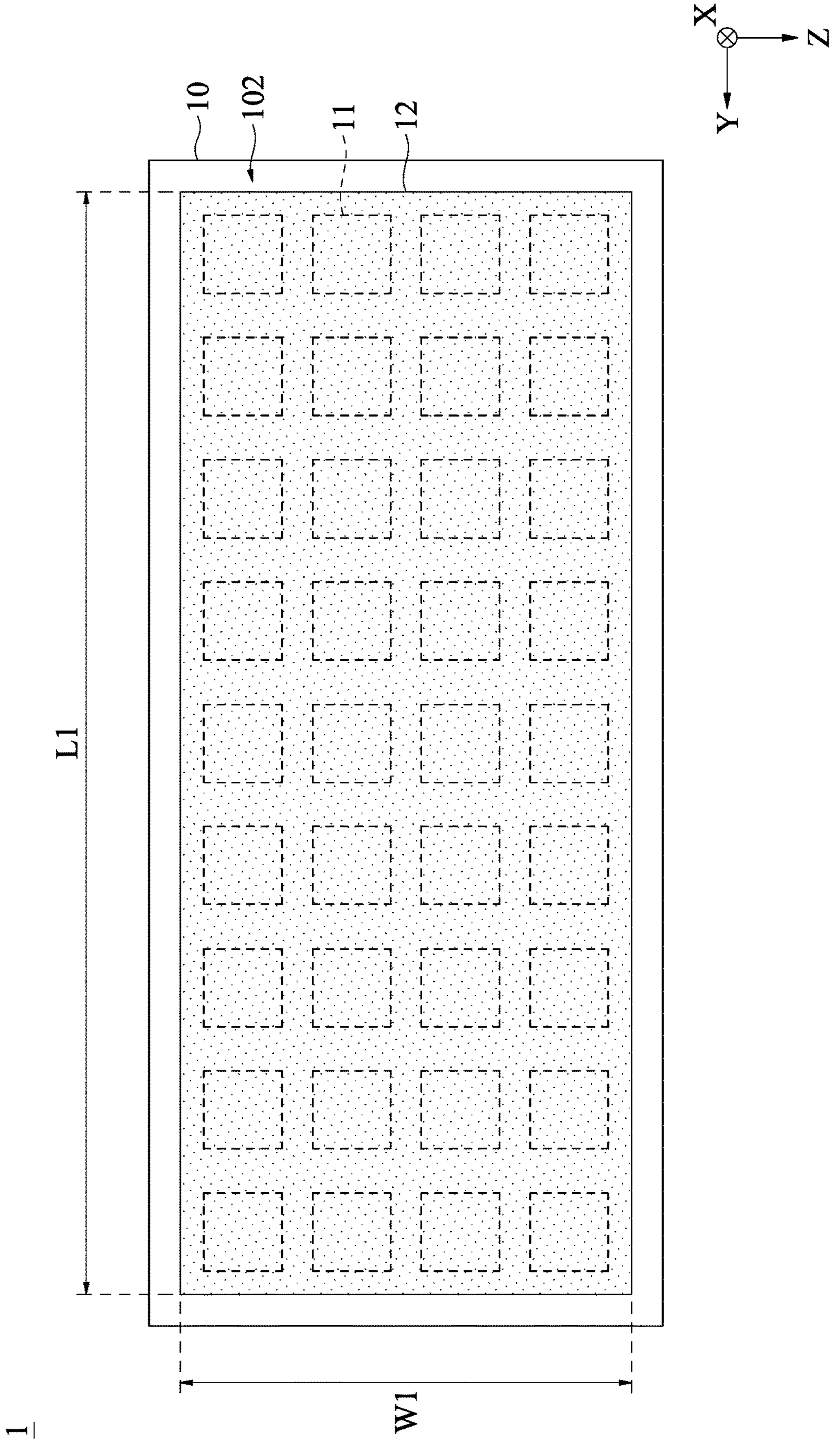
FIG. 6 illustrates a schematic structural view in a bottom view (i.e., the YZ plane) of a packaging element (comprising a substrate, a plurality of dies, and an adhesive material) according to an embodiment of the instant disclosure.

In step S12, attach an adhesive material 12 to a lower surface 102 of the substrate 10, as shown in FIG. 4 and FIG. 6, and the adhesive material 12 has a first curing temperature. The adhesive material 12 may be a thin-film layer made of any polymer material and having a length L1 (as shown in FIG. 5 and FIG. 6), a width W1 (as shown in FIG. 6), and a thickness (as shown in FIG. 5). The material of the adhesive material 12 may be, but not limited to, an epoxy resin with fillers. The first curing temperature refers to the temperature at which the polymer material is so cross-linked to cause phenomena of toughening and hardening, and the cross-linking of the polymer material may be induced by applying heat or ultraviolet (UV) light.

In step S13, apply a liquid-packaging material 13 to surroundings of the dies 11 (shown in FIG. 5), and the liquid-packaging material 13 has a second curing temperature. The liquid-packaging material 13 may be any liquid encapsulation sealant (LES), and thus the liquid-packaging material 13 does not need to be further heated but already in a liquid state at room temperature (around 25° C. or within a reasonable error range thereof, e.g., 22° C. to 27° C.). The liquid-packaging material 13 may be, but not limited to, an epoxy resin with fillers. The surroundings of the dies 11 refer to anywhere in the proximity of the dies 11 on the upper surface 101 of the substrate 10, which may further comprise the upper sides and/or the lower sides of the dies 11 (i.e., between the dies 11 and the upper surface 101 of the substrate 10). The liquid-packaging material 13 applied to the surroundings of the two adjacent dies 11 may be connected to each other or not connected to each other. For example, in FIG. 5, the liquid-packaging material 13 is applied to the surroundings of the dies 10 and filled between those dies 10 adjacent to each other, and the liquid-packaging material 13 is a thin-film layer having a length L2 and a thickness T2. Accordingly, after the liquid-packaging material 13 is applied to the surroundings of the dies 11 and subjected to the following curing steps, the dies 11 can be more stably fixed to the upper surface 101 of the substrate 10 through the liquid-packaging material 13. The definition of the second curing temperature may be referred to the above-mentioned definition of the first curing temperature, and the second curing temperature may be greater than, equal to, or less than the first curing temperature.

In some embodiments, the first curing temperature and the second curing temperature may substantially refer to a lower value of a first-curing-temperature range and a lower value of a second-curing-temperature range. Hence, in some embodiments, through being heated to a temperature greater than the lower value of the first-curing-temperature range (and the temperature is located within the first-curing-temperature range) or a temperature greater than the lower value of the second-curing-temperature range (and the temperature is located within the first-curing-temperature range or the second-curing-temperature range), the curing reaction of the adhesive material 12 or the liquid-packaging material 13 may begin to be induced. In contrast, through being heated to a temperature greater than the upper value of the first-curing-temperature range or a temperature greater than the upper value of the second-curing-temperature range, the adhesive material 12 or the liquid-packaging material 13 would crack, and/or excessive stress would be generated, both of which are detrimental to the curing reaction of the adhesive material 12 and the liquid-packaging material 13.

For example, the material of the adhesive material 12 may be, for example, an epoxy resin with fillers with its first curing temperature ranging from 120° C. to 150° C.; the material of the liquid-packaging material 13 may be, for example, an epoxy resin with fillers with its second curing temperature ranging from 120° C. to 150° C.

In step S14, heat the substrate 10, the dies 11, the adhesive material 12, and the liquid-packaging material 13 to a heating temperature not less than the first curing temperature of the adhesive material 12 and the second curing temperature of the liquid-packaging material 13. Since the heating temperature is set to be not less than the first curing temperature (or not less than the lower value of the first-curing-temperature range) and the second curing temperature (or not less than the lower value of the second-curing-temperature range), during the heating process, the curing reaction of the adhesive material 12 and the liquid-packaging material 13 can be induced. In some embodiments, in step S14, the substrate 10, the dies 11, the adhesive material 12, and the liquid-packaging material 13 are further maintained at the heating temperature for a while to ensure that the curing reaction of the adhesive material 12 and the liquid-packaging material 13 can be sufficiently induced.

In step S15, cool the substrate 10, the adhesive material 11, the adhesive material 12, and the liquid-packaging material 13 to a room temperature. In some embodiments, during the process of cooling to the room temperature, it is necessary to ensure that the liquid-packaging material 13 is still connected to the upper surface 101 of the substrate 10 and the adhesive material 12 is still connected to the lower surface 102 of the substrate 10. Accordingly, when being cooled to the room temperature (or during the process of cooling to the room temperature), the liquid-packaging material 13 applies an upper-surface shrinkage stress to the upper surface 101 of the substrate 10, the adhesive material 12 applies a lower-surface shrinkage stress to the lower surface 102 of the substrate 10, and the lower-surface shrinkage stress is substantially equal to the upper-surface shrinkage stress. Therefore, the shrinkage stresses that the upper surface 101 and the lower surface 102 of the substrate 10 are subjected to are substantially equal to each other, so that the substrate 10 can reduce (or even prevent from) the warpage occurred to substrate 10 due to the shrinkage of the liquid-packaging material 13 on the upper surface 101 resulted from the curing.

It is noted that, the method as described above may already be a method that can be used to reduce (or even prevent from) the warpage occurred to the substrate 10 during the filling process. A person of ordinary skill in the art would appreciate that the method S1 for reducing warpage occurred to the substrate 10 during the filling process may be modified equivalently according to various needs for manufacturing processes and can still solve the above-mentioned technical problems (e.g., reducing (or even preventing from) the warpage occurred to the substrate 10 during the filling process) to produce corresponding technical results.

Figure 8:
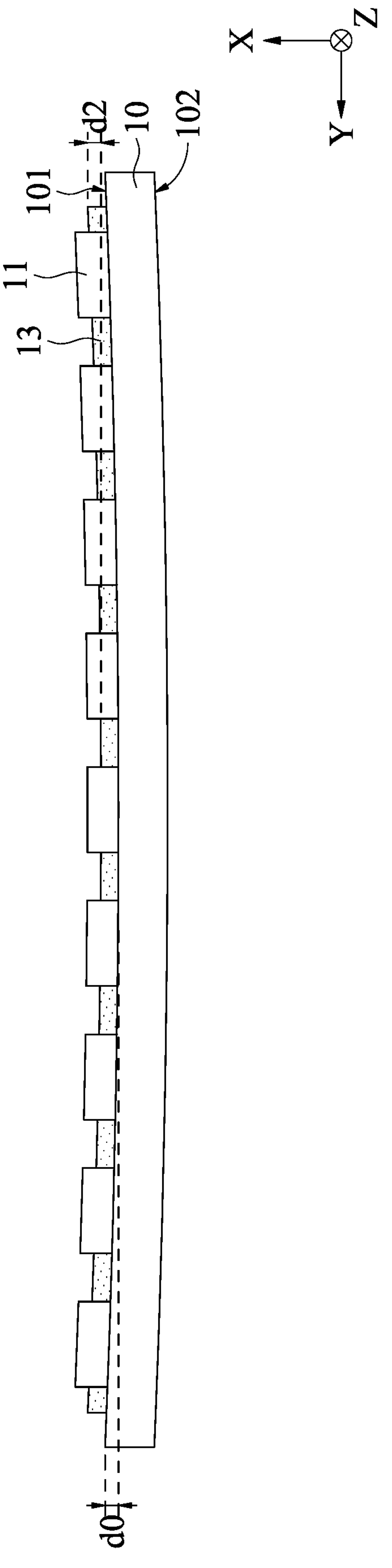
FIG. 8 illustrates a schematic view in the XY plane showing a warpage structure and the degree of warpage occurred to a conventional substrate and a plurality of conventional dies.
Figure 9:
FIG. 9 illustrates a schematic view in the XY plane showing a warpage structure and the degree of warpage occurred to the adhesive material according to an embodiment of the instant disclosure.

Please further refer to FIG. 8 and FIG. 9. FIG. 8 illustrates a schematic view in the XY plane showing a warpage structure and the degree of warpage occurred to a conventional substrate 10 and a plurality of conventional dies 11 that are heated and cured, and FIG. 9 illustrates a schematic view in the XY plane showing a warpage structure and the degree of warpage occurred to the adhesive material 12 that is heated and cured.

In FIG. 8, since the liquid-packaging material 13 is a polymer material, during the heating and curing processes, the liquid-packaging material 13 would shrink and further apply a shrinkage stress (e.g., the upper-surface shrinkage stress) to the substrate 10 (e.g., the upper surface 101). The degree of warpage occurred to the liquid-packaging material 13 may be denoted by a warpage amount d2 as shown in FIG. 8, and the warpage amount d2 refers to a height difference between the highest point(s) (e.g., the points at two ends) and the lowest point(s) (e.g., the low point in the middle) on the upper surface of the liquid-packaging material 13.

Moreover, in some embodiments, since the substrate 10 itself comprises organic components, the substrate 10 itself would also shrink and warp, thereby leading to the warpage occurred to the substrate 10. In addition, the difference between the coefficient of thermal expansions (CTEs) of the liquid-packaging material 13 and the substrate 10 would also lead to the warpage occurred to the substrate 10. The overall warpage occurred to the substrate 10 caused by the warpage phenomena resulted from the above reasons can be denoted by the warpage amount do as shown in FIG. 8, and the warpage amount do refers to a height difference between the highest point(s) (e.g., the points at two ends) and the lowest point(s) (e.g., the low point in the middle) on the upper surface 101 of the substrate 10.

As shown in FIG. 9, during the heating and curing processes identical to those of FIG. 8, the adhesive material 12 would also shrink and thus be able to apply the shrinkage stress to the substrate 10. The degree of warpage occurred to the adhesive material 12 may be denoted by a warpage amount d1 as shown in FIG. 9, and the warpage amount d1 refers to a height difference between the highest point(s) (e.g., the points at two ends) and the lowest point(s) (e.g., the low point in the middle) on the lower surface of the adhesive material 12. In some embodiments, the warpage amount d1 of the adhesive material 12 is substantially equal to or greater than the warpage amount d2 of the liquid-packaging material 13.

In some embodiments, the warpage amount do of the substrate 10 is substantially equal to 0 (zero). Alternatively, in some embodiments, the warpage amount do of the substrate 10 is slightly greater than 0 (that is, the upper-surface shrinkage stress applied to the upper surface 101 of the substrate 10 by the liquid-packaging material 13 is slightly greater than the lower-surface shrinkage stress) or slightly less than 0 (that is, the lower-surface shrinkage stress applied to the lower surface 102 of the substrate 10 by the adhesive material 12 is slightly greater than the upper-surface shrinkage stress).

In some embodiments, based on the warpage amount d1 of the adhesive material 12 and the warpage amount d2 of the liquid-packaging material 13, various parameters and/or conditions can be further adjusted to obtain different warpage phenomena (i.e., the warpage amounts d0) on the substrate 10 caused by different parameters and/or conditions. By collecting the warpage amounts d1, d2, various parameters and/or conditions and the correspondingly resulted warpage amounts d0, a corresponding warpage empirical relationship can be obtained. Furthermore, in some embodiments, for those substrates 10 with identical specification (e.g., the fixed size and material), the adjustable parameters and/or conditions may be, but not limited to, at least one selected from the following: the material combination of the adhesive material 12 and the liquid-packaging material 13, the thickness (T1 or T2) combination, the length (L1 or L2) combination, the width (W1 or the width of the liquid-packaging material 13) combination, the heating temperature, the ratio of the area of the adhesive material 12 over the area of the substrate 10, and the ratio of the area of the liquid-packaging material 13 over the area of the substrate 10. The final resulted warpage phenomena (i.e., the warpage amount d0) can be respectively obtained through adjusting one or more of the above parameters and/or conditions, and the corresponding warpage empirical relationship can be obtained through collecting those parameters and/or conditions and the corresponding warpage phenomena. By further changing to another substrate 10 with different specification (e.g., different size or material), with the assistance of the parameter and/or condition combination of the adhesive material 12 and the liquid-packaging material 13, much more warpage empirical relationships corresponding to the substrates 10 of various specifications can be obtained. Accordingly, in regards to the substrate 10 of certain specifications, according to the obtained warpage empirical relationships of the substrate 10, the corresponding parameters and/or conditions can be further obtained, so that what specifications of the adhesive material 12 and the liquid-packaging material 13 with what conditions for the filling process should be selected could be correspondingly obtained. Hence, in some embodiments, the warpage occurred to the substrate 10 during the filling process may be maximally reduced (or even prevented from). It is noted that, the parameter and/or condition combinations of the adhesive material 12 and the liquid-packaging material 13 as well as the specification of the substrate 10 can be adjusted according to various demands, all of which can be further used to establish a more complete warpage empirical relationship of the substrate 10.

Therefore, in some embodiments, after the warpage empirical relationship is established, simply according to the specifications of the existing substrate 10, the adhesive material 12, and the liquid-packaging material 13, the corresponding parameters and/or conditions can be subsequently retrieved to carry out the filling process that can also achieve the effects of reducing (or even preventing from) the warpage occurred to the substrate 10 during the filling process.

Please refer again to FIG. 1A. After the step S15 is conducted, step S16 is further conducted by: removing the adhesive material 12. The term "removing/removal" can refer to being removed by applying various physical external forces (such as knives and/or fixtures), or by physical and/or chemical effects (such as hydrolysis and/or pyrolysis). Accordingly, in some embodiments, since the overall substrate 10 has been cooled to the room temperature, removing the adhesive material 12 under this circumstance would not further affect the degree of warpage occurred to the overall substrate 10, and thus the flatness of the substrate 10 can still be maintained.

In some embodiments, after the step S16 is conducted or in the meanwhile of conducting the step S16, step S17 is further conducted by: cutting the substrate 10 to separate the dies 11 from each other. For example, in FIG. 1A, the method S1 for reducing warpage occurred to the substrate 10 during the packaging process is conducted by cutting the substrate 10 after the adhesive material 12 is removed to separate the dies 11 from each other, thereby completing a singulation process.

Figure 1B:
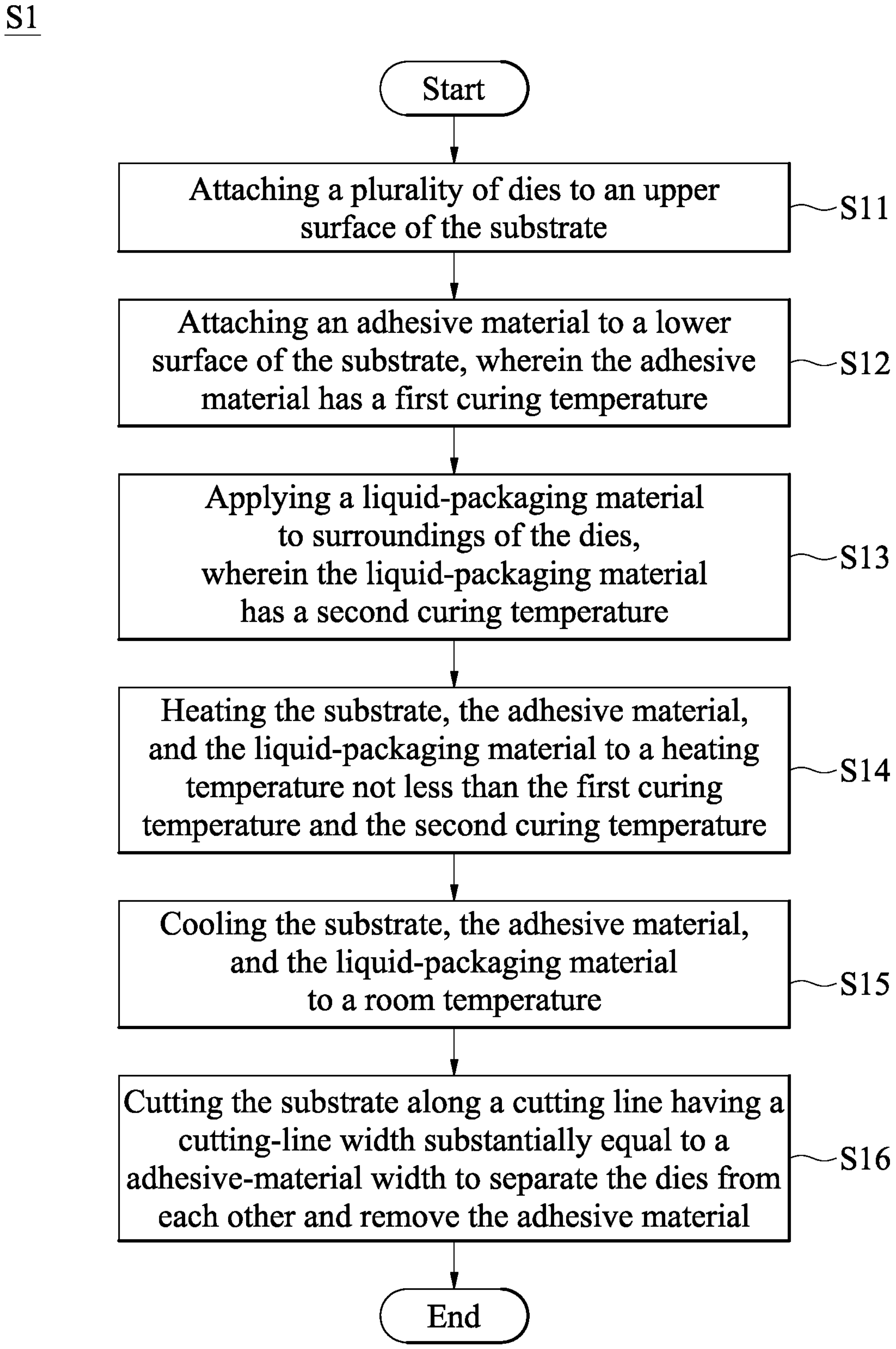
FIG. 1B illustrates a flow chart of a method for reducing warpage occurred to a substrate during a packaging process according to a second embodiment of the instant disclosure.
Figure 7A:
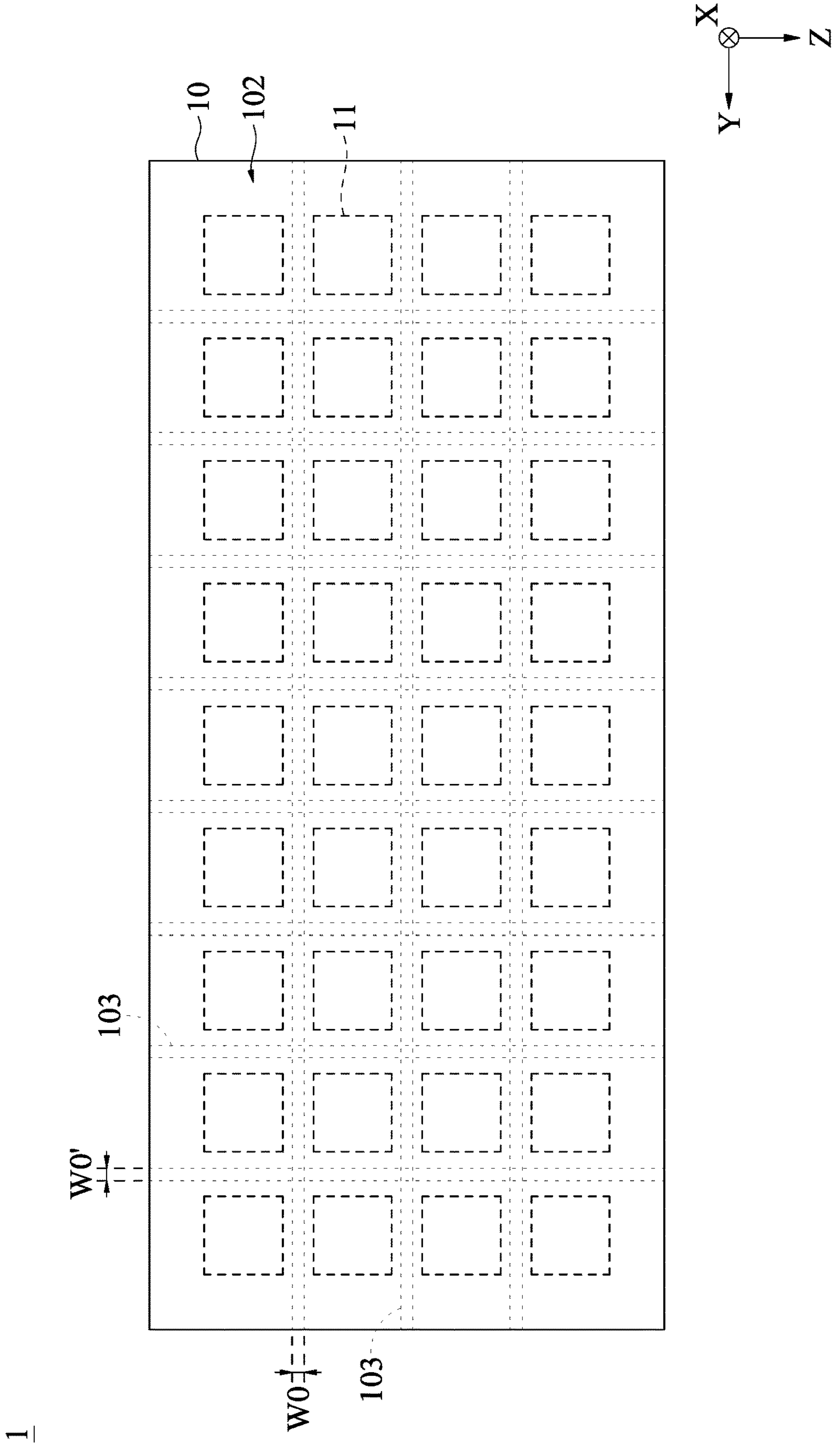
FIG. 7A illustrates a schematic structural view in a bottom view (i.e., the YZ plane) of a packaging element (comprising a substrate, a plurality of dies, and an adhesive material) according to an embodiment of the instant disclosure.
Figure 7B:
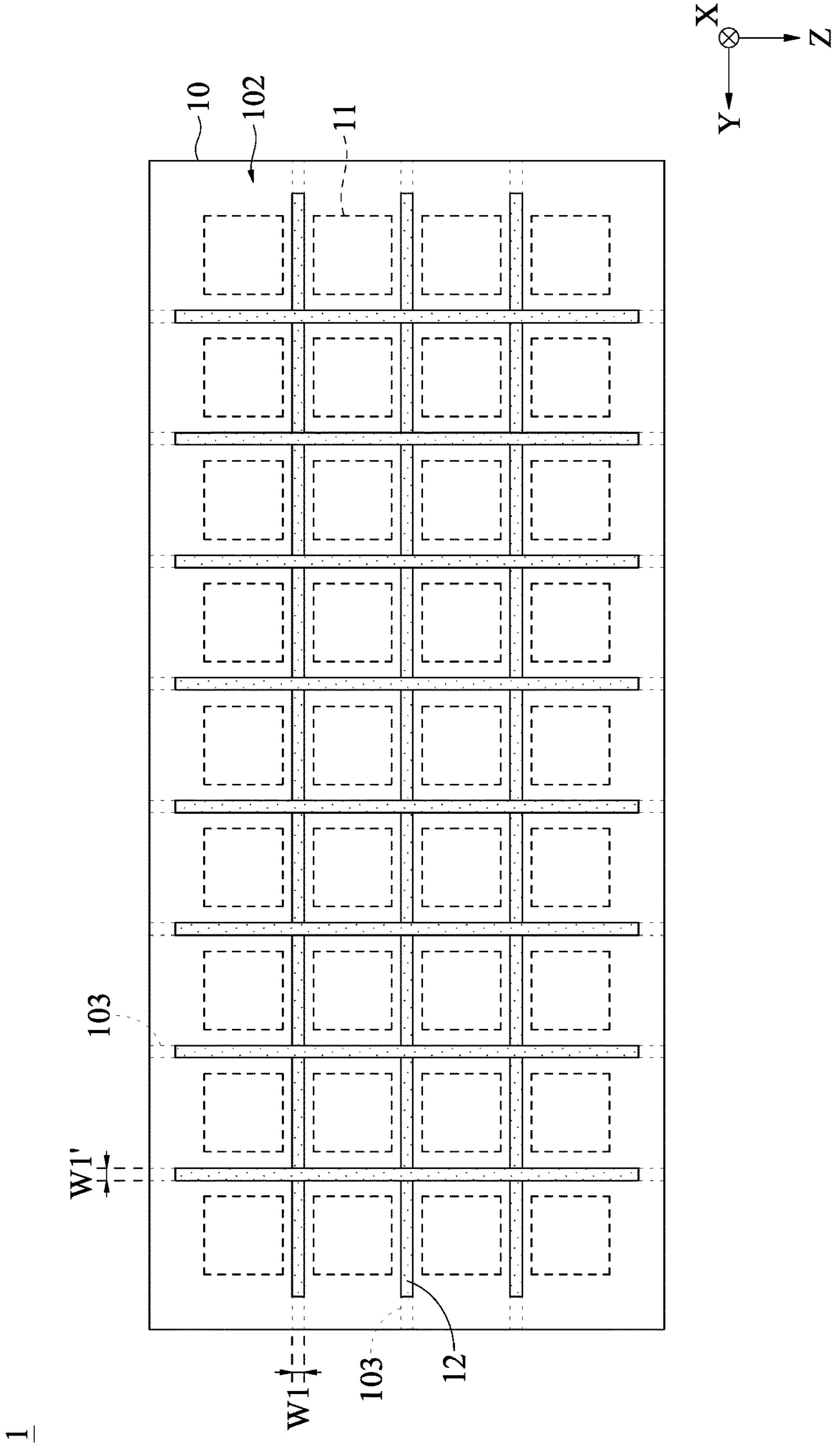
FIG. 7B illustrates a schematic structural view in a bottom view (i.e., the YZ plane) of a second embodiment of a packaging element (comprising a substrate, a plurality of dies, and an adhesive material) according to an embodiment of the instant disclosure.

Please refer to FIG. 1B, which is a flow chart of a method S1 for reducing warpage occurred to a substrate 10 during a packaging process according to a second embodiment of the instant disclosure. As compared with FIG. 1A, the main difference of the method S1 for reducing warpage occurred to the substrate 10 during a packaging process shown in FIG. 1B is that: the step S16 shown in FIG. 1B is the step in combination of the steps S16 and S17 shown in FIG. 1A. In other words, in the embodiments shown in FIG. 1B, the method S1 for reducing warpage occurred to the substrate 10 during a packaging process is conducted by removing part of or the entire of the adhesive material 12 in the meanwhile of cutting the substrate 10. With reference to FIG. 7A and FIG. 7B, the step S16 is further described in detail as follows; and embodiments of the rest of steps can be referred to the above-mentioned description, which are thus not further described in detail herein.

Please refer to FIG. 7A and FIG. 7B, which are schematic structural views in bottom views (i.e., the YZ plane) of packaging elements 1 (each comprising the substrate 10, the dies 11, and the adhesive material 12) according to embodiments of the instant disclosure. In FIG. 7A and FIG. 7B, the substrate 10 further has one or more cutting lines 103. The cutting lines 103 refers to routes that the cutting tools or fixtures are expected to pass by during the subsequent cutting process of the substrate 10, so the cutting lines 103 may be a track or a groove that is actually made on the substrate 10 (which can be on the upper surface 101 and/or the lower surface 102), or may be a virtual cutting route expected to be followed during the cutting process. As shown in FIG. 7A, the cutting lines 103 along the width direction (i.e., the Z direction) of the substrate 10 may respectively have a cutting-line width W0, the cutting lines 103 along the length direction (i.e., the Y direction) of the substrate 10 may respectively have a cutting-line width W0', and the cutting-line width W0 and the cutting-line width W0' may be identical to or different from each other. In the step S12 of FIG. 1B, the adhesive material 12 is attached to the lower surface 102 of the substrate 10 and corresponds to part of or the entire of the cutting lines 103 (shown in FIG. 7B). As shown in FIG. 7B, the adhesive material 12 along the width direction (i.e., the Z direction) of the substrate 10 may respectively have an adhesive-material width W1, the adhesive material 12 along the length direction (i.e., the Y direction) of the substrate 10 may respectively have an adhesive-material width W1', and the adhesive-material width W1 and the adhesive-material width W1' correspond to the cutting-line width W0 and the cutting-line width W0', respectively. That is, in some embodiments, the adhesive-material width W1 is substantially equal to or less than the cutting-line width W0, and the adhesive-material width W1' is substantially equal to or less than the cutting-line width W0'. Hence, in the step S16 of FIG. 1B, when cutting the substrate 10 along the cutting lines 103, the adhesive material 12 would also be removed together. In addition, in some embodiments, when the width of the cutting tools is substantially greater than or equal to the adhesive-material width W1 and the adhesive-material width W1', in the step S16 of FIG. 1B, the adhesive material 12 corresponding to the cutting lines 103 can be removed together through cutting the substrate 10 directly along the cutting lines 103.

The following describes a method for reducing warpage occurred to a substrate during a molding process according to some embodiments.

Figure 10A:
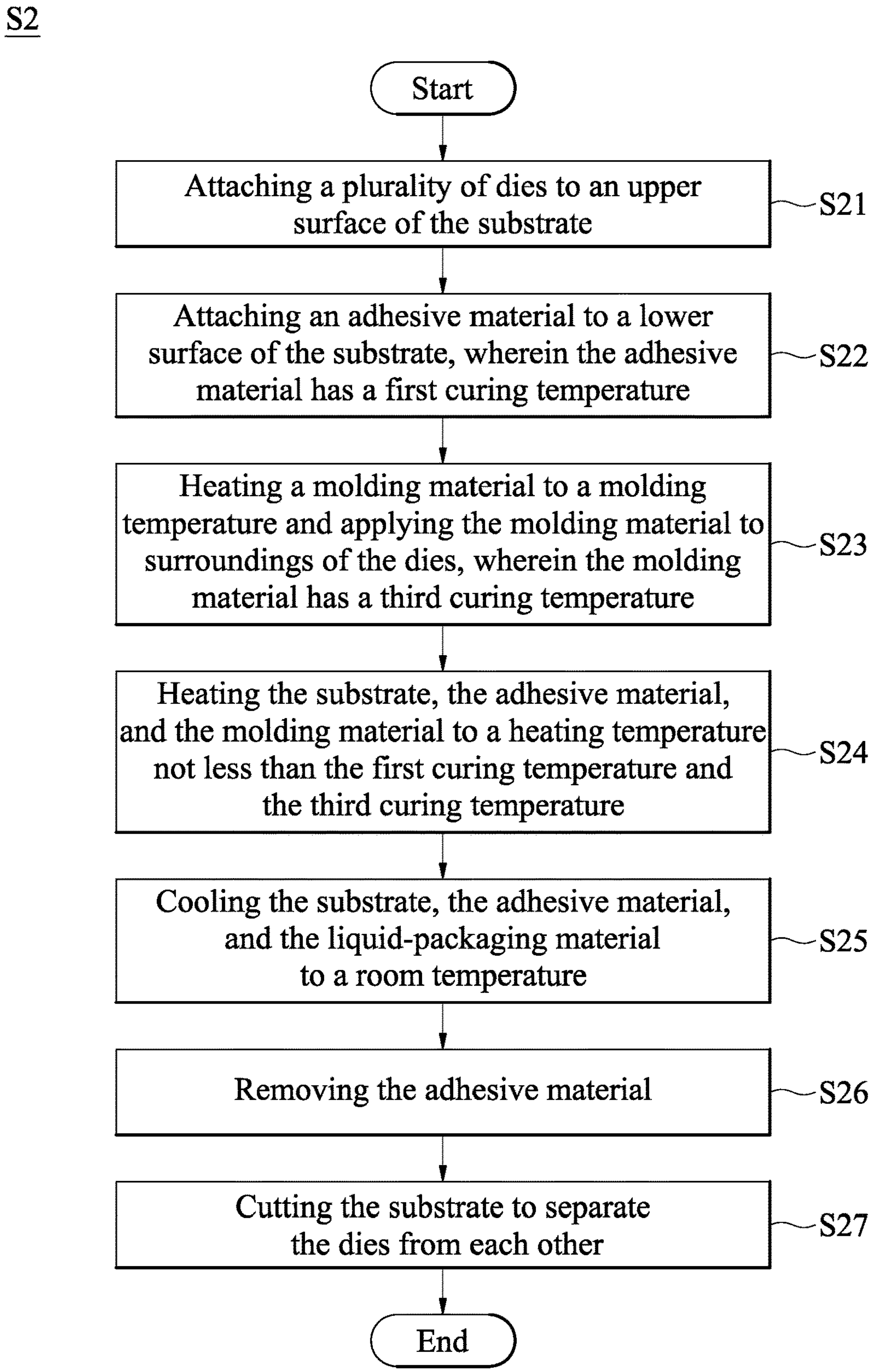
FIG. 10A illustrates a flow chart of a method for reducing warpage occurred to a substrate during a packaging process according to a third embodiment of the instant disclosure.
Figure 11:
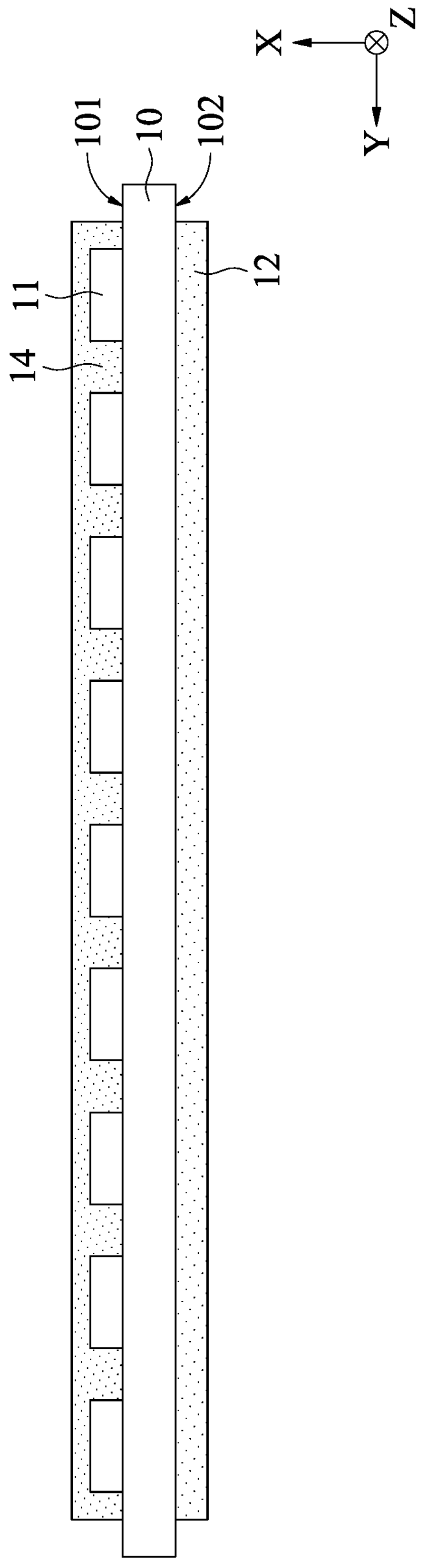
FIG. 11 illustrates a schematic structural view in the XY plane of the substrate, the dies, and the adhesive material according to an embodiment of the instant disclosure.

Please refer to FIG. 10A, which is a flow chart of a method S2 for reducing warpage occurred to a substrate 10 during a packaging process according to a third embodiment of the instant disclosure. With reference to FIG. 11, steps S21 to S27 are described in detail as follows.

In step S21, attach a plurality of dies 11 to the upper surface 101 of the substrate 10, as shown in FIG. 11. The step S21 is similar to the step S11, so the embodiments of the step S21 can be referred to the above-mentioned description of the step S11, which are thus not further described in detail herein.

In step S22, attach an adhesive material 12 to a lower surface 102 of the substrate 10, as shown in FIG. 11, and the adhesive material 12 has a first curing temperature. The step S22 is similar to the step S12, so the embodiments of the step S22 can be referred to the above-mentioned description of the step S12, which are thus not further described in detail herein.

In step S23, heat a molding material 14 to a molding temperature and apply the molding material 14 to surroundings of the dies 11, and the molding material 14 has a third curing temperature. The molding material 14 may be any epoxy molding compound (EMC). Since the meting point (or the glass transition temperature) of the molding material 14 is greater than the room temperature, the molding material 14 is in a solid state at room temperature and needs to be heated by the molding equipment to exceed its melting point (or its glass transition temperature) before it becomes fluid. In other words, the molding temperature is at least greater than or equal to the meting point (or the glass transition temperature) of the molding material 14. The material of the molding material 14 may be, but not limited to, an epoxy resin with fillers. The surroundings of the dies 11 refer to anywhere in the proximity of the dies 11 on the upper surface 101 of the substrate 10, which may further comprise the upper side and/or the lower side of the dies 11 (i.e., between the dies 11 and the upper surface 101 of the substrate 10). For example, in FIG. 11, the molding material 14 is applied to the upper side and the surroundings of the dies 10 to wrap the dies 11 in the molding material 14. Accordingly, after the molding material 14 is applied to the surroundings of the dies 11 and subjected to the following curing steps, the dies 11 can be more stably fixed to the upper surface 101 of the substrate 10 through the molding material 14. Further, the contacts on the active surface of the dies 11 and the wiring between the epoxy resin with fillers of the dies 11 and the substrate 10 can also be protected by the molding material 14. The definition of the third curing temperature may be referred to the above-mentioned definition of the first curing temperature, and the third curing temperature may be greater than, equal to, or less than the first curing temperature.

For example, the material of the adhesive material 12 may be, for example, an epoxy resin with fillers with its first curing temperature ranging from 120° C. to 150° C.; the material of the molding material 14 may be, for example, an epoxy resin with fillers with its third curing temperature ranging from 120° C. to 150° C.

In step S24, heat the substrate 10, the dies 11, the adhesive material 12, and the molding material 14 to a heating temperature not less than the first curing temperature and the third curing temperature. Since the heating temperature is not less than the first curing temperature (or not less than the lower value of the first-curing-temperature range) and the third curing temperature (or not less than the lower value of the third-curing-temperature range), during the heating process, the curing reaction of the adhesive material 12 and the molding material 14 can be induced. In some embodiments, in step S24, the substrate 10, the dies 11, the adhesive material 12, and the molding material 14 are further maintained at the heating temperature for a while to ensure that the curing reaction of the adhesive material 12 and the molding material 14 can be sufficiently induced.

In step S25, cool the substrate 10, the adhesive material 11, the adhesive material 12, and the molding material 14 to a room temperature. In some embodiments, during the process of cooling to the room temperature, it is necessary to ensure that the molding material 14 is still connected to the upper surface 101 of the substrate 10 and the adhesive material 12 is still connected to the lower surface 102 of the substrate 10. Accordingly, when being cooled to the room temperature (or during the process of cooling to the room temperature), the molding material 14 applies an upper-surface shrinkage stress to the upper surface 101 of the substrate 10, the adhesive material 12 applies a lower-surface shrinkage stress to the lower surface 102 of the substrate 10, and the lower-surface shrinkage stress is substantially equal to the upper-surface shrinkage stress. Therefore, the shrinkage stresses that the upper surface 101 and the lower surface 102 of the substrate 10 are subjected to are substantially equal to each other, so that the substrate 10 can reduce (or even prevent from) the warpage occurred to substrate 10 due to the shrinkage of the molding material 14 on the upper surface 101 resulted from the curing.

It is noted that, the method as described above may already be a method that can be used to reduce (or even prevent from) the warpage occurred to the substrate 10 during the molding process. A person of ordinary skill in the art would appreciate that the method S2 for reducing warpage occurred to the substrate 10 during the molding process may be modified equivalently according to various needs for manufacturing processes and can still solve the above-mentioned technical problems (e.g., reducing (or even preventing from) the warpage occurred to the substrate 10 during the molding process) to produce corresponding technical results.

Since the molding material 14 is a polymer material, during the heating and curing processes, the molding material 14 would also shrink and further apply a shrinkage stress to the substrate 10. The degree of warpage occurred to the molding material 14 may be defined with reference to the definition of the degree of warpage occurred to the liquid-packaging material 13 shown in FIG. 8 (e.g., the warpage amount d2), which is thus not further described in detail herein. In addition, as mentioned above, the substrate 10 itself would also shrink and warp, with the difference between the coefficient of thermal expansions (CTEs) of the molding material 14 and the substrate 10, all of which would also lead to the overall warpage occurred to the substrate 10. The overall warpage occurred to the substrate 10 can be denoted by the warpage amount do as shown in FIG. 8, and the detailed definition can be referred to the above-mentioned description, which is thus not further described in detail herein. Furthermore, as mentioned above, during the heating and curing processes, the adhesive material 12 would also shrink and warp as shown in FIG. 9 (e.g., the warpage amount d1), and thus the adhesive material 12 would be able to apply the shrinkage stress to the substrate 10; and the detailed definition can be referred to the above-mentioned description, which is thus not further described in detail herein.

In some embodiments, based on the warpage amount d1 of the adhesive material 12 and the warpage amount d2 of the molding material 14, various parameters and/or conditions can be further adjusted to obtain different warpage phenomena (i.e., the warpage amounts d0) on the substrate 10 caused by different parameters and/or conditions. By collecting the warpage amounts d1, d2, various parameters and/or conditions and the correspondingly resulted warpage amounts d0, a corresponding warpage empirical relationship can be obtained. Furthermore, in some embodiments, for those substrates 10 with identical specification (e.g., the fixed size and material), the adjustable parameters and/or conditions may be, but not limited to, at least one selected from the following: the material combination of the adhesive material 12 and the molding material 14, the thickness combination, the length combination, the width combination, the heating temperature, the ratio of the area of the adhesive material 12 over the area of the substrate 10, and the ratio of the area of the molding material 14 over the area of the substrate 10. The final resulted warpage phenomena (i.e., the warpage amount d0) can be respectively obtained through adjusting one or more of the above parameters and/or conditions, and the corresponding warpage empirical relationship can be obtained through collecting those parameters and/or conditions and the corresponding warpage phenomena. By further changing to another substrate 10 with different specification (e.g., different size or material), with the assistance of the parameter and/or condition combination of the adhesive material 12 and the molding material 14, much more warpage empirical relationships corresponding to the substrates 10 of various specifications can be obtained. Accordingly, in regards to the substrate 10 of certain specifications, according to the obtained warpage empirical relationships of the substrate 10, the corresponding parameters and/or conditions can be further obtained, so that what specifications of the adhesive material 12 and the molding material 14 with what conditions for the molding process should be selected could be correspondingly obtained. Hence, in some embodiments, the warpage occurred to the substrate 10 during the molding process may be maximally reduced (or even prevented from). It is noted that, the parameter and/or condition combinations of the adhesive material 12 and the molding material 14 as well as the specification of the substrate 10 can be adjusted according to various demands, all of which can be further used to establish a more complete warpage empirical relationship of the substrate 10.

In some embodiments, after the warpage empirical relationship is established, simply according to the specifications of the existing substrate 10, the adhesive material 12, and the molding material 14, the corresponding parameters and/or conditions can be subsequently retrieved to carry out the molding process that can also achieve the effects of reducing (or even preventing from) the warpage occurred to the substrate 10 during the molding process.

Please refer again to FIG. 10A. After the step S25 is conducted, step S26 is further conducted by: removing the adhesive material 12. The step S26 is similar to the step S16, and thus embodiments of the step S26 can be referred to the above-mentioned description regarding the step S16, which are thus not further described in detail herein. Accordingly, in some embodiments, since the overall substrate 10 has been cooled to the room temperature, removing the adhesive material 12 under this circumstance would not further affect the degree of warpage occurred to the overall substrate 10, and thus the flatness of the substrate 10 can still be maintained.

In some embodiments, after the step S26 is conducted or in the meanwhile of conducting the step S26, step S27 is further conducted by: cutting the substrate 10 to separate the dies 11 from each other. The step S27 is similar to the step S17, and thus embodiments of the step S27 can be referred to the above-mentioned description regarding the step S17, which are thus not further described in detail herein.

Figure 10B:
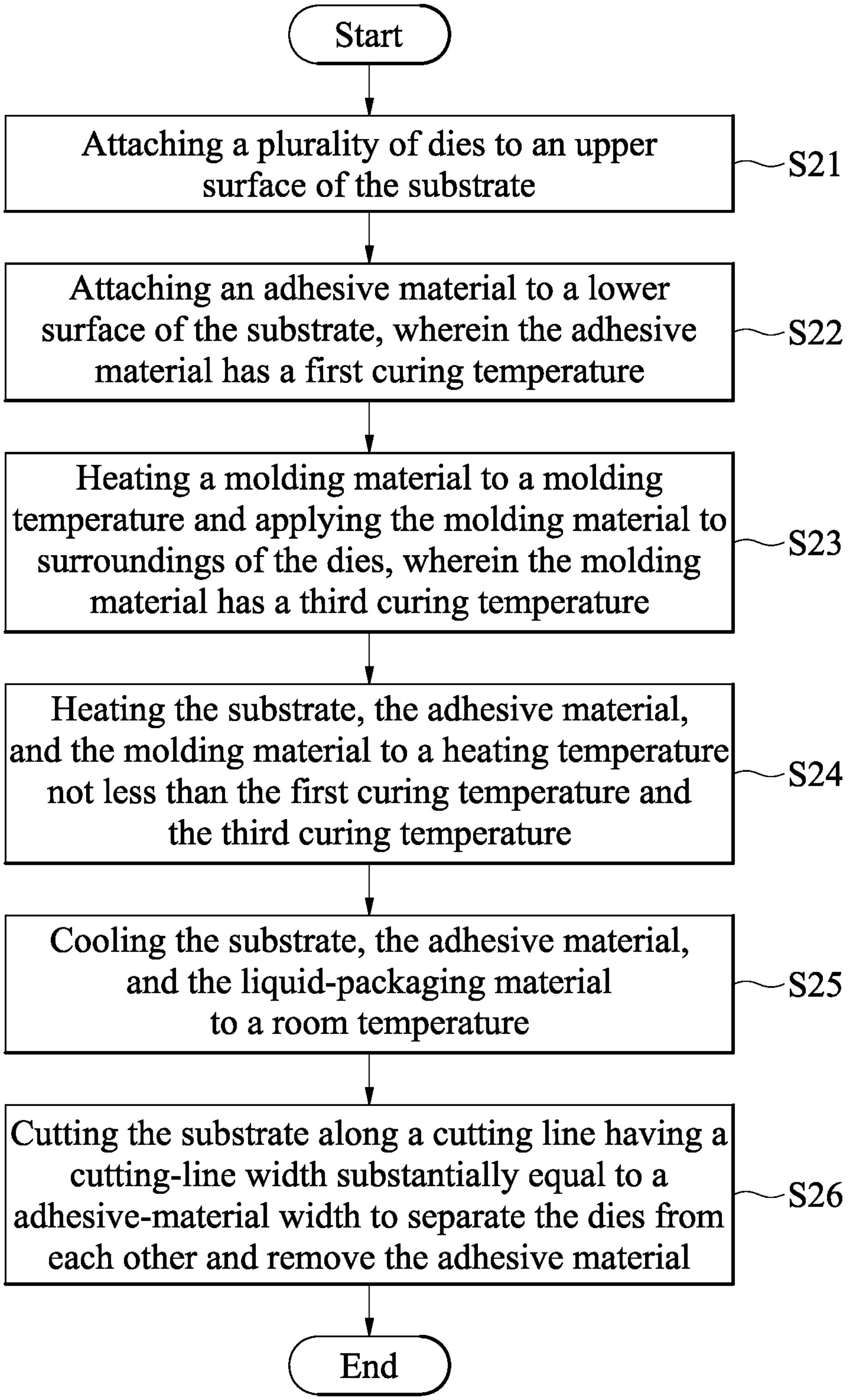
FIG. 10B illustrates a flow chart of a method for reducing warpage occurred to a substrate during a packaging process according to a fourth embodiment of the instant disclosure.

Please refer to FIG. 10B, which is a flow chart of a method S2 for reducing warpage occurred to a substrate 10 during a packaging process according to a fourth embodiment of the instant disclosure. As compared with FIG. 10A, the main difference of the method S2 for reducing warpage occurred to the substrate 10 during a packaging process shown in FIG. 10B is that: the step S26 shown in FIG. 10B is the step in combination of the steps S26 and S27 shown in FIG. 10A. In other words, in the embodiments shown in FIG. 10B, the method S2 for reducing warpage occurred to the substrate 10 during a packaging process is conducted by removing part of or the entire of the adhesive material 12 in the meanwhile of cutting the substrate 10. The step S26 shown in FIG. 10B is similar to the step S16 shown in FIG. 1B, and thus the embodiments of the step S26 shown in FIG. 10B can be referred to the above-mentioned description regarding the step S16 shown in FIG. 1B, which are thus not further described in detail herein.

It should be particularly noted that, for ease of describing steps of the methods S1, S2 for reducing warpage occurred to the substrate 10 during a packaging process, sizes and warpage amounts of elements are appreciated to be not exactly depicted according to actual scales in the attached figures of the instant disclosure.

Although the present disclosure is disclosed in the foregoing embodiments as above, it is not intended to limit the instant disclosure. Any person who is familiar with the relevant art can make some changes and modifications without departing from the spirit and scope of the present disclosure. Therefore, the scope of the present disclosure shall be subject to the definition of the scope of patent application attached to the specification.

What is claimed is:

1. A method for reducing warpage occurred to a substrate during a packaging process, comprising:

attaching a plurality of dies to an upper surface of the substrate;

attaching an adhesive material to a lower surface of the substrate, wherein the adhesive material has a first curing temperature;

applying a liquid-packaging material to surroundings of the dies, wherein the liquid-packaging material has a second curing temperature;

heating the substrate, the adhesive material, and the liquid-packaging material to a heating temperature not less than the first curing temperature and the second curing temperature; and cooling the substrate, the adhesive material, and the liquid-packaging material to a room temperature;

wherein when being cooled to the room temperature, the liquid-packaging material applies an upper-surface shrinkage stress to the upper surface of the substrate, the adhesive material applies a lower-surface shrinkage stress to the lower surface of the substrate, and the lower-surface shrinkage stress is substantially equal to the upper-surface shrinkage stress.

2. The method according to claim 1, wherein after cooling the substrate, the adhesive material, and the liquid-packaging material to the room temperature, the method further comprises:

removing the adhesive material.

3. The method according to claim 2, wherein the adhesive material is removed through hydrolysis and/or pyrolysis.

4. The method according to claim 2, wherein after removing the adhesive material, the method further comprises:

cutting the substrate to separate the dies from each other.

5. The method according to claim 1, wherein after cooling the substrate, the adhesive material, and the liquid-packaging material to the room temperature, the method further comprises:

cutting the substrate along a cutting line to separate the dies from each other.

6. The method according to claim 5, wherein the adhesive material is attached to the cutting line, the adhesive material has an adhesive-material width, and the cutting line has a cutting-line width substantially equal to the adhesive-material width to remove the adhesive material through cutting the substrate along the cutting line.

* * * * *